(12) United States Patent
Kim

(10) Patent No.: US 6,908,785 B2
(45) Date of Patent: Jun. 21, 2005

(54) MULTI-CHIP PACKAGE (MCP) WITH A CONDUCTIVE BAR AND METHOD FOR MANUFACTURING THE SAME

(75) Inventor: Gu-Sung Kim, Kyungki-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 155 days.

(21) Appl. No.: 10/306,931

(22) Filed: Nov. 27, 2002

(65) Prior Publication Data

US 2003/0107119 A1 Jun. 12, 2003

(30) Foreign Application Priority Data

Dec. 6, 2001 (KR) ........................................ 2001-77048

(51) Int. Cl.[7] .......................... H01L 21/44; H01L 21/48; H01L 21/50
(52) U.S. Cl. .......................... 438/106; 438/109; 438/125
(58) Field of Search ................................ 438/106, 109, 438/126

(56) References Cited

U.S. PATENT DOCUMENTS

| | | | | | |
|---|---|---|---|---|---|
| 5,432,999 | A | * | 7/1995 | Capps et al. ............... | 438/109 |
| 5,457,879 | A | * | 10/1995 | Gurtler et al. ............. | 438/108 |
| 5,481,133 | A | * | 1/1996 | Hsu ........................ | 257/621 |
| 5,781,415 | A | * | 7/1998 | Itoh ....................... | 361/790 |
| 5,917,388 | A | * | 6/1999 | Tronche et al. ............ | 333/246 |
| 6,444,576 | B1 | * | 9/2002 | Kong ....................... | 438/667 |
| 6,577,013 | B1 | * | 6/2003 | Glenn et al. .............. | 257/777 |
| 6,664,616 | B2 | * | 12/2003 | Tsubosaki et al. .......... | 257/668 |
| 6,727,115 | B2 | * | 4/2004 | Van Hoff .................. | 438/106 |
| 6,727,116 | B2 | * | 4/2004 | Poo et al. ................ | 438/106 |
| 2004/0115863 | A1 | * | 6/2004 | Oyama ..................... | 438/106 |

FOREIGN PATENT DOCUMENTS

| | | |
|---|---|---|
| JP | 06-291250 | 10/1994 |
| JP | 08-264712 | 10/1996 |
| JP | 10-163411 | 6/1998 |
| JP | 2000-260933 | 9/2000 |

OTHER PUBLICATIONS

English language abstract for Japanese Patent No. 06–291250.
English language abstract for Japanese Patent No. 08–264712.
English language abstract for Japanese Patent No. 10–163411.
English language abstract for Japanese Publish Application No 2000–260933.

* cited by examiner

Primary Examiner—Michael S. Lebentritt
Assistant Examiner—Angel Roman
(74) Attorney, Agent, or Firm—Marger Johnson & McCollom, P.C.

(57) ABSTRACT

A multi-chip package (MCP) is provided. The MCP comprises a plurality of stacked semiconductor chips, each including a chip pad and a first insulating layer overlying the chip pad with an opening to expose a portion of the chip pad. Each chip additionally includes a pad redistribution line formed on the first insulating layer and a second insulating layer covering the pad redistribution line. A via hole is formed through the chip, the first insulating layer, a pad redistribution line and the second insulating layer. The MCP further includes a protective layer formed on the bottom of the lowest semiconductor chip. The protective layer includes a conductive pad formed opposite the bottom of the lowest semiconductor chip. A conductive bar extends through the via holes of the stacked semiconductor chips, from the conductive pad, and is electrically connected to the pad redistribution line of the stacked semiconductor chips.

21 Claims, 10 Drawing Sheets

US 6,908,785 B2

MULTI-CHIP PACKAGE (MCP) WITH A CONDUCTIVE BAR AND METHOD FOR MANUFACTURING THE SAME

RELATED APPLICATIONS

This application claims priority from Korean Patent Application No. 2001-77048, filed on Dec. 6, 2001, the contents of which are incorporated herein by reference in their entirety.

BACKGROUND OF THE INVENTION

1. Field of the Invention

The present invention relates to the field of semiconductor devices and, more particularly, to a multi-chip package (MCP) and a method for manufacturing the same.

2. Description of the Related Art

Spurred on by new developments in semiconductor technology and user demands, recent trends in the electronics industry have been towards miniaturization and decreased weight. To meet these demands, multi-chip packages (MCPs) were introduced, which include a plurality of semiconductor chips in a single package.

Various three-dimensional MCPs have been developed, and in particular, new technology has been introduced for chip level stacking rather than package level stacking. The chip level stacking process interposes a thin substrate between the semiconductor chips and stacks the semiconductor chips by using solder or other materials, providing easy access to electrical interconnections at the chip level and to embodiments of chip size packages. The stack packaging method has the advantages of a simple manufacturing process and design flexibility. Furthermore, it may also be achieved by use of conventional processes. However, the stack packaging described above also has several drawbacks such as increased package thickness due to the insertion of the substrate, an increased manufacturing cost and poor heat dissipation, thereby limiting the stackable number of semiconductor chips. In order to overcome these problems, technology has been employed to form via holes in a wafer, fill the via holes with metal and vertically stack the semiconductor chips using solder bumps.

FIG. 1 is a cross-sectional view of a conventional MCP. As shown in FIG. 1, the conventional MCP 110 has a pad redistribution line 117 disposed toward the edges of a main surface of a semiconductor chip 111 and connected to a chip pad 113. A plurality of semiconductor chips 111 are vertically stacked using solder bumps 127. Each semiconductor chip 111 has a metal layer 125 that vertically penetrates the chip 111 and is connected to the pad redistribution line 117. A lowest semiconductor chip 111 is attached to a substrate 131. On the surface opposite to the chip-attached surface of the substrate 131 are formed solder balls 141. The solder balls 141 serve as external connection terminals.

The conductive metal layer 125 is formed by filling via holes 123 formed at the wafer level or the chip level with a metal. On the lower surface of the metal layer 125 are attached the solder bumps 127.

The stacking of the plurality of semiconductor chips 111 is achieved by attaching the lowest semiconductor chip 111 to the substrate 131 and then proceeding with a reflow, followed by the next chip, and then another reflow process, and so on. The solder bumps 127 of an upper semiconductor chip 111 are in contact with the conductive metal layer 125 of a lower semiconductor chip 111. Therefore, electrical interconnections are established in the stacked chips.

The conventional MCP eliminates the need for a separate interposer, thereby reducing the manufacturing cost and the package thickness. However, since the semiconductor chips are electrically interconnected using the solder bumps, adhesive strength changes due to warpage of the stacked chips and chip alignment failures may occur during the chip stacking process. The conventional MCP also requires several solder reflow steps and an additional substrate for stacking the semiconductor chips.

SUMMARY OF THE INVENTION

A multi-chip package (MCP) is provided. The MCP comprises a plurality of stacked semiconductor chips, each including a chip pad and a first insulating layer overlying the chip pad with an opening to expose a portion of the chip pad. Each chip additionally includes a pad redistribution line formed on the first insulating layer and a second insulating layer covering the pad redistribution line. A via hole is formed through the chip, the first insulating layer, a pad redistribution line and the second insulating layer. The MCP further includes a protective layer formed on the bottom of the lowest semiconductor chip. The protective layer includes a conductive pad formed opposite the bottom of the lowest semiconductor chip. A conductive bar extends through the via holes of the stacked semiconductor chips, from the conductive pad, and is electrically connected to the pad redistribution line of the stacked semiconductor chips.

Therefore, the present invention prevents the adhesive strength failure due to the increased chip thickness and warpage of the semiconductor chip while simultaneously stacks the plurality of chips without several solder reflow steps.

BRIEF DESCRIPTION OF THE DRAWINGS

These and other objects, features and advantages of the present invention will be readily understood with reference to the following detailed description provided in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 1:
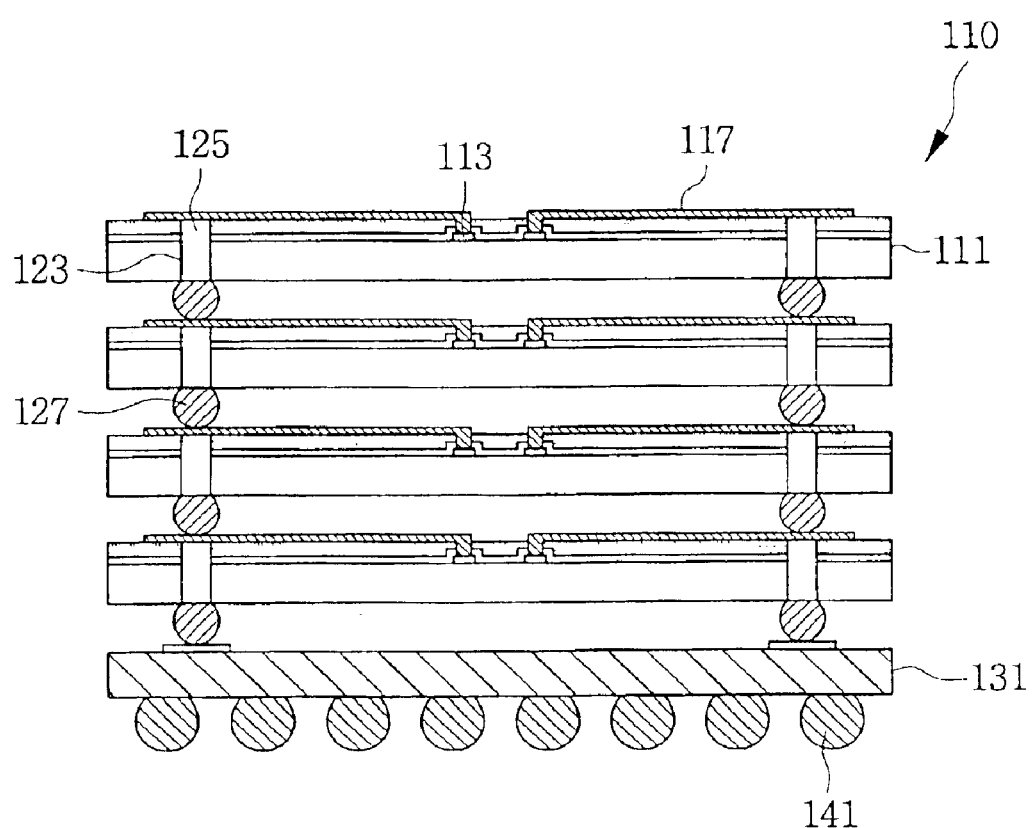
FIG. 1 is a cross-sectional view of a conventional MCP.
Figure 2:
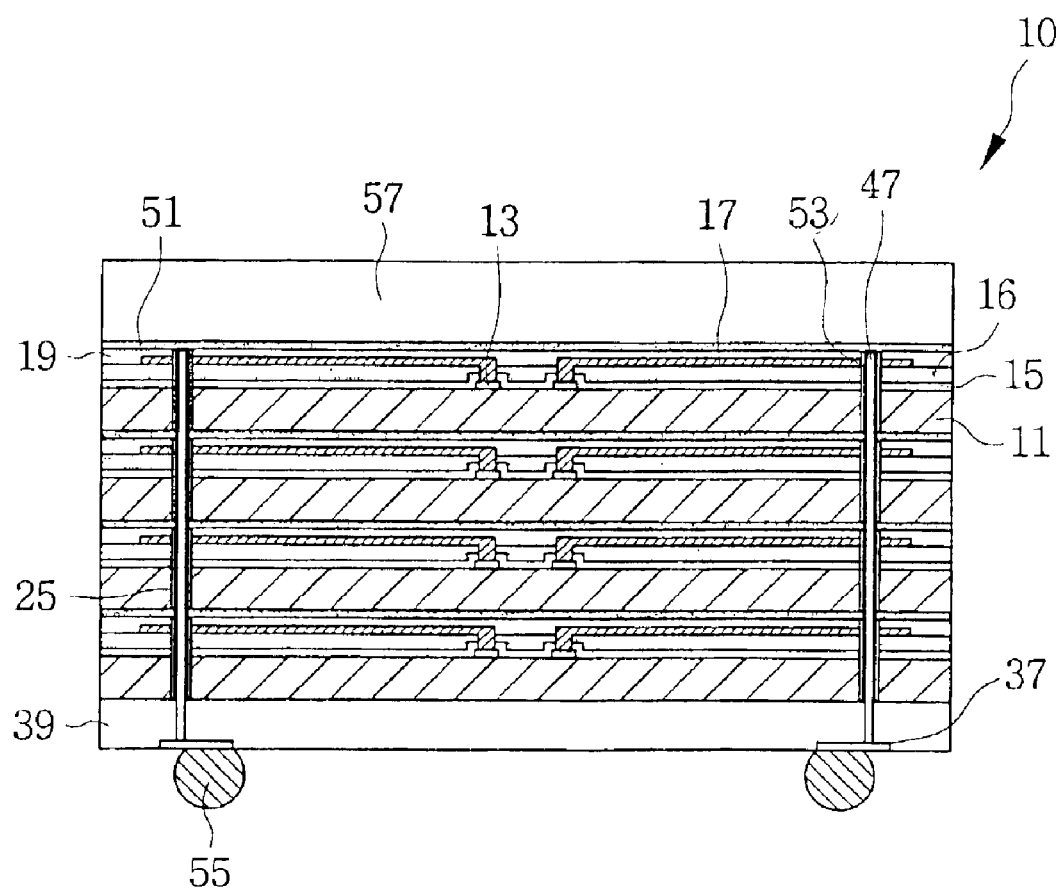
FIG. 2 is a cross-sectional view of a MCP in accordance with one embodiment of the present invention.

FIG. 2 is a cross-sectional view of a MCP in accordance with one embodiment of the present invention. Referring to FIG. 2, a MCP 10 has a plurality of semiconductor chips 11 that are vertically stacked. Each semiconductor chip 11 includes a passivation layer 15 covering the main surface thereof having an integrated circuit (IC), leaving a central portion of a chip pad 13 open. A first insulating layer 16 is formed on the passivation layer 15 and a pad redistribution line 17 is formed on the first insulating layer 16. The pad redistribution line 17 is connected to the chip pad 13 through the first insulating layer 16 and extends to the edges of the chip 11 beyond the IC region. The pad redistribution line 17 is covered with a second insulating layer 19. A via hole 25 is formed at the edge of the chip 11 and penetrates the semiconductor chip 11, the first insulating layer 16, the pad redistribution line 17, and the second insulating layer 19.

An adhesive layer 51 formed of elastomer is interposed between the semiconductor chips 11. A protective layer 39, including a conductive pad 37, e.g., a metal pad, is formed on the bottom of the lowest semiconductor chip 11. A conductive bar 47, e.g., a metal bar, is inserted through the via hole 25 of the stacked semiconductor chips 11, starting from the conductive pad 37. The conductive bar 47 is also connected to the pad redistribution line 17, for example, by a plating layer 53. Other suitable methods can be used to connect the pad redistribution line 17 and the conductive bar 47, within the spirit and scope of the present invention. External connection terminals such as solder balls 55 are formed on the conductive pad 37. A cap layer 57 is optionally attached to the uppermost semiconductor chip 11.

According to an embodiment of the present invention, the conductive bar 47 and the pad redistribution line 17 are electrically interconnected by plating layer 53. The solder bumps between semiconductor chips required by the conventional method for chip stacking is not necessary in the present invention, thereby significantly reducing the total package thickness. Furthermore, removal of the conventional substrate makes the package thinner. The present invention reduces interfaces between the adjacent chips 11, consequently improving electrical characteristics, and does not restrain the number of semiconductor chips 11 that can be stacked.

MCPs of the present invention can be manufactured using processes described below.

Semiconductor Chip Fabrication Process

Figure 3:
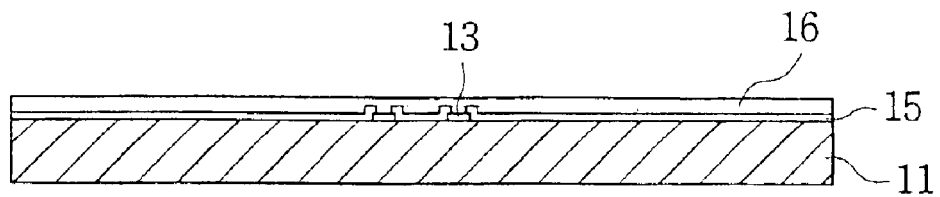
FIGS. 3 through 22 are cross-sectional views of a method for manufacturing a MCP in accordance with one embodiment of the present invention.

FIGS. 3 through 10 are cross-sectional views illustrating a semiconductor chip fabrication process for manufacturing a MCP according to an embodiment of the present invention. Referring to FIG. 3, IC (not shown) is formed in the semiconductor chip 11. The chip pad 13 connected to the IC is exposed through the passivation layer 15 covering the main surface of the semiconductor chip 11. The first insulating layer 16 is formed on the semiconductor chip 11 to cover the chip pad 13 and the passivation layer 15. A layer of insulating material such as polyimide may be used as the first insulating layer 16.

Figure 4:
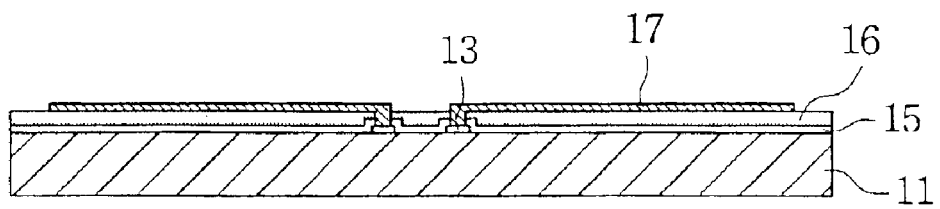

As shown in FIG. 4, the pad redistribution line 17 is formed on the first insulating layer 16 and connected to the chip pad 13 at one end. The pad redistribution line 17 extends to the outside of the cell area, in particular, to a chip edge that is not occupied by the IC, and then forms at the other end a redistributed pad with a hollow cylindrical shape of a predetermined size. Such processes can be performed with a patterning method such as photo-etching using a patterned photoresist. After the patterning is completed, the photoresist is removed.

Figure 5:
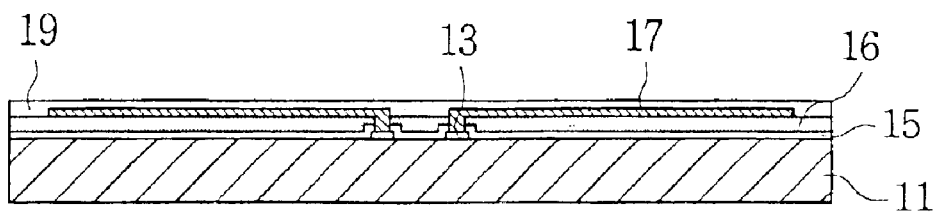
Figure 6:
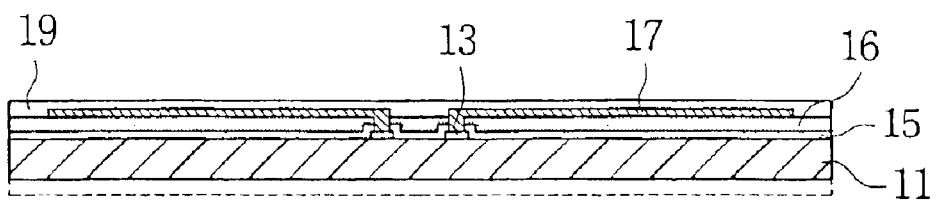

As depicted in FIG. 5, the second insulating layer 19 is formed on the first insulating layer 16 and covers the pad redistribution line 17. A layer of insulating material such as polyimide may be used as the second insulating layer 19. Back lapping is preferably carried out on the semiconductor chip 11 as shown in FIG. 6. The backside of the semiconductor chip 11, i.e. the side of the chip opposite to the pad-attached surface, is thinned to a predetermined thickness, thereby reducing the total semiconductor package thickness.

Figure 7:
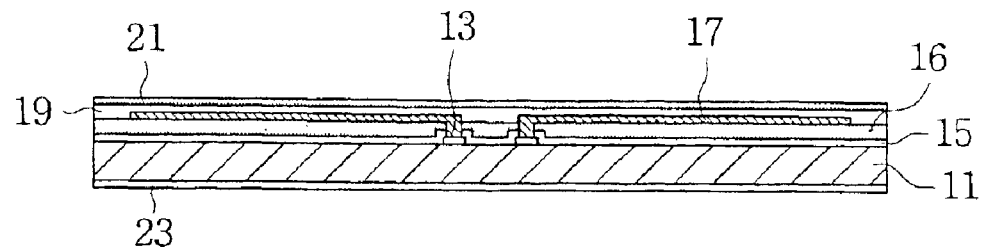
Figure 8:
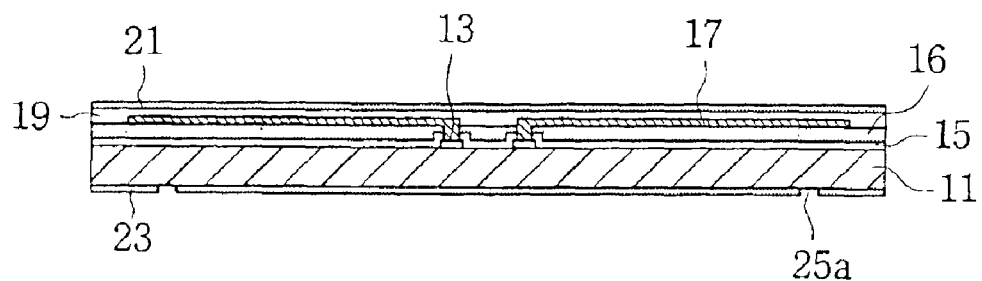

When the back lapping is completed, photosensitive polymer layers 21 and 23 such as photosensitive polyimide layers are formed on both sides of the semiconductor chip 11 as shown in FIG. 7. Then, a hole 25a is formed in the lower photosensitive polyimide layer 23 for opening the area corresponding to the redistributed pad of the pad redistribution line 17, as shown in FIG. 8.

Figure 9:
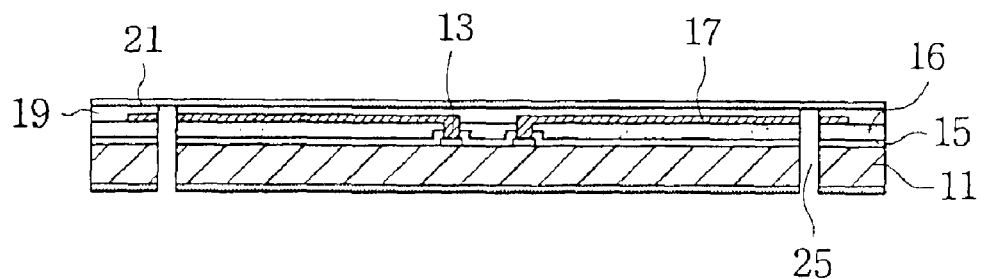

Referring to FIG. 9, the via hole 25 is formed by, for example, a sputtering method using a high density plasma with the lower photosensitive polyimide layer 23 as a mask. The via hole 25 penetrates through the semiconductor chip 11, the passivation layer 15, the first insulating layer 16, the pad redistribution line 17 and the second insulating layer 19. As an additional part of the process, wet etching may be performed to remove burrs from the via hole 25.

Figure 10:
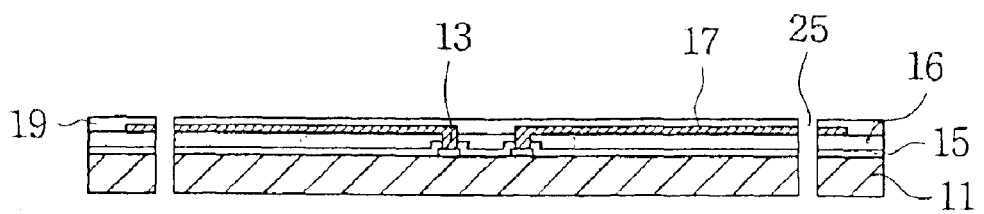

Referring to FIG. 10, the upper and lower photosensitive polyimide layers 21 and 23 are removed. The above-described semiconductor chip fabrication process may be performed at the wafer level.

Substrate Fabricating Process:

FIGS. 11 through 17 are cross-sectional views of the substrate fabricating process in the method for manufacturing a MCP according to an embodiment of the present invention.

Figure 11:

A photosensitive polymer layer 33 is formed on one side of a temporary substrate 31 as shown in FIG. 11. The substrate 31 may be made of, for example, sapphire or smooth glass or other materials having a low coefficient of thermal expansion. To form the layer 33, a photosensitive polymer is applied to the upper surface of the substrate 31 and cured.

Figure 12:
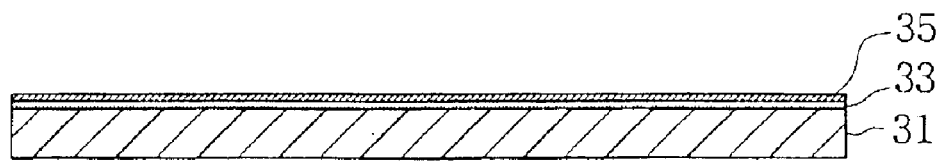

Next, the conductive pad 37 is formed on the photosensitive polymer layer 33. Specifically, as shown in FIG. 12, a seed metal layer 35 is formed on the photosensitive polymer layer 33.

Figure 13:
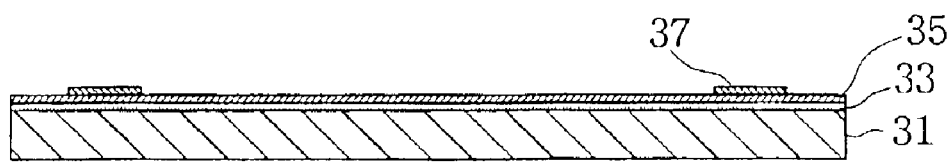

Referring to FIG. 13, the conductive pad 37 is formed by a pattern plating technique. The seed metal layer 35 may be removed in a subsequent process such as a plasma milling process or during the formation of the conductive pad 37. In addition, the pattern plating process for forming the conductive pad 37 may form other wiring patterns, if necessary. The conductive pad 37 is provided as a terminal for an external connection, i.e., to connect with the solder ball formed in a subsequent step. Therefore, preferably, the conductive pad 37 is a multi-layer structure such as nickel/copper/copper/chromium for good solder ball mountability and improved electrical characteristics. All the conductive pads 37 may be arranged in a two-dimensional matrix.

Figure 14:
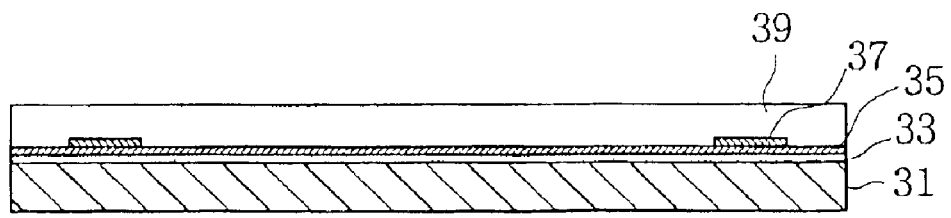
Figure 15:
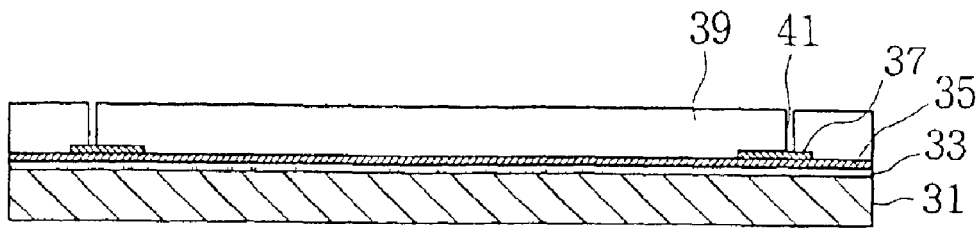
Figure 16:
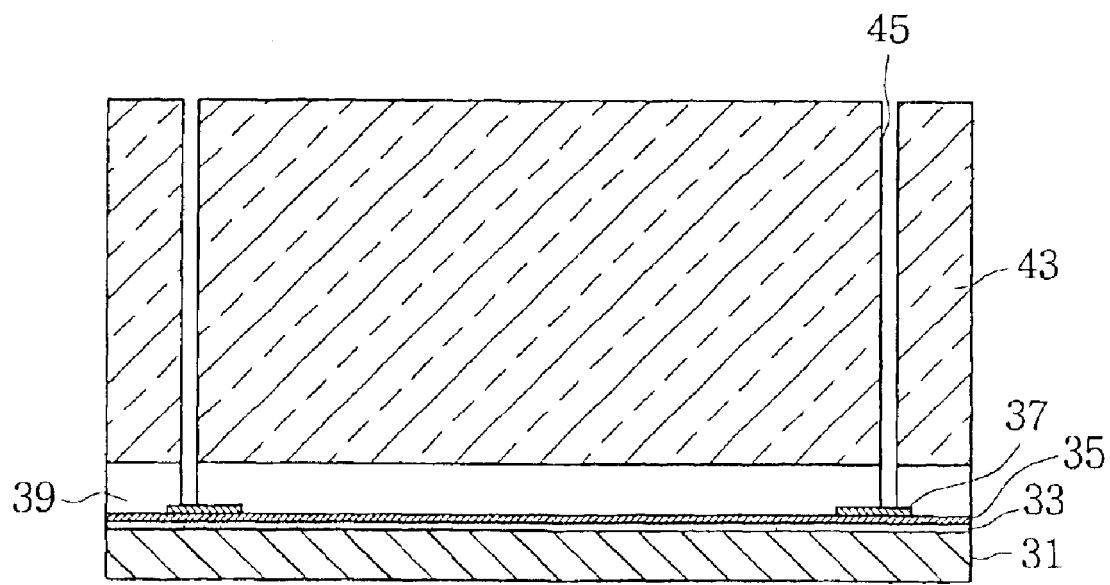

Now referring to FIG. 14, a protective layer 39 is formed on the photosensitive polymer layer 33 to a thickness sufficient to cover the conductive pad 37. Preferably, the protective layer 39 is formed of polyimide. Then, referring to FIG. 15, a first opening 41 is formed in the protective layer 39 by photo etching and curing to expose a portion of the conductive pad 37. The protective layer 39 is then covered with a photoresist layer 43 as shown in FIG. 16. The photoresist layer 43 has a thickness corresponding to the total stack thickness of the semiconductor chips described before. A second opening 45 is formed in the photoresist layer 43 to meet the first opening 41.

Figure 17:
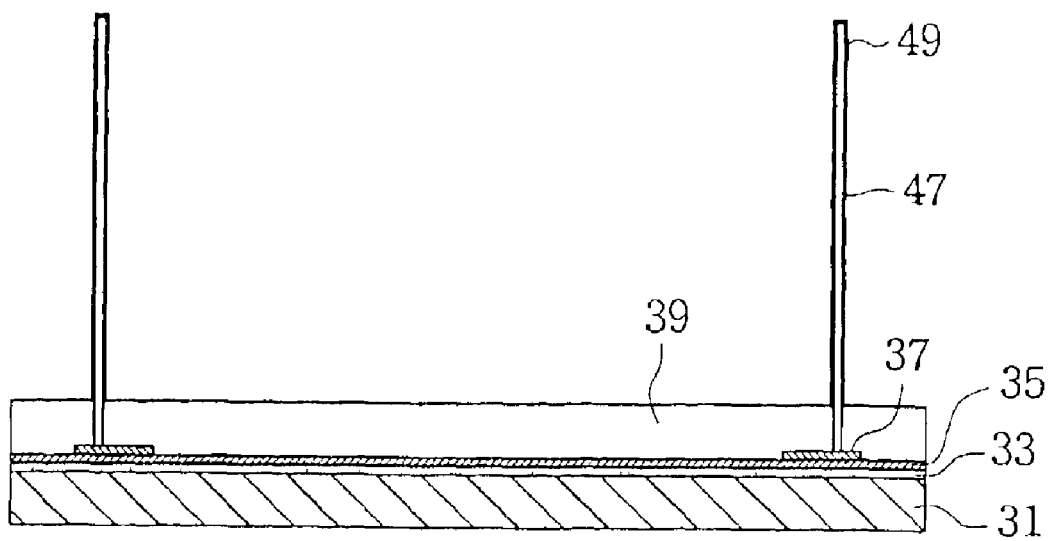

Next, referring to FIGS. 16 and 17, a conductive bar 47 is formed in both of the openings 41 and 45, and then the photoresist layer 43 is removed. The conductive bar 47 is therefore connected to the conductive pad 37. Preferably, plating is used for forming the conductive bar 47. After the removal of the photoresist layer 43, a coating layer 49 is formed on the conductive bar 47 by, for example, nickel electroless plating to prevent oxidation.

Chip Stacking Process:

FIGS. 18 through 22 are cross-sectional views of a chip stacking process in the method for manufacturing the MCP according to an embodiment of the present invention.

Figure 18:
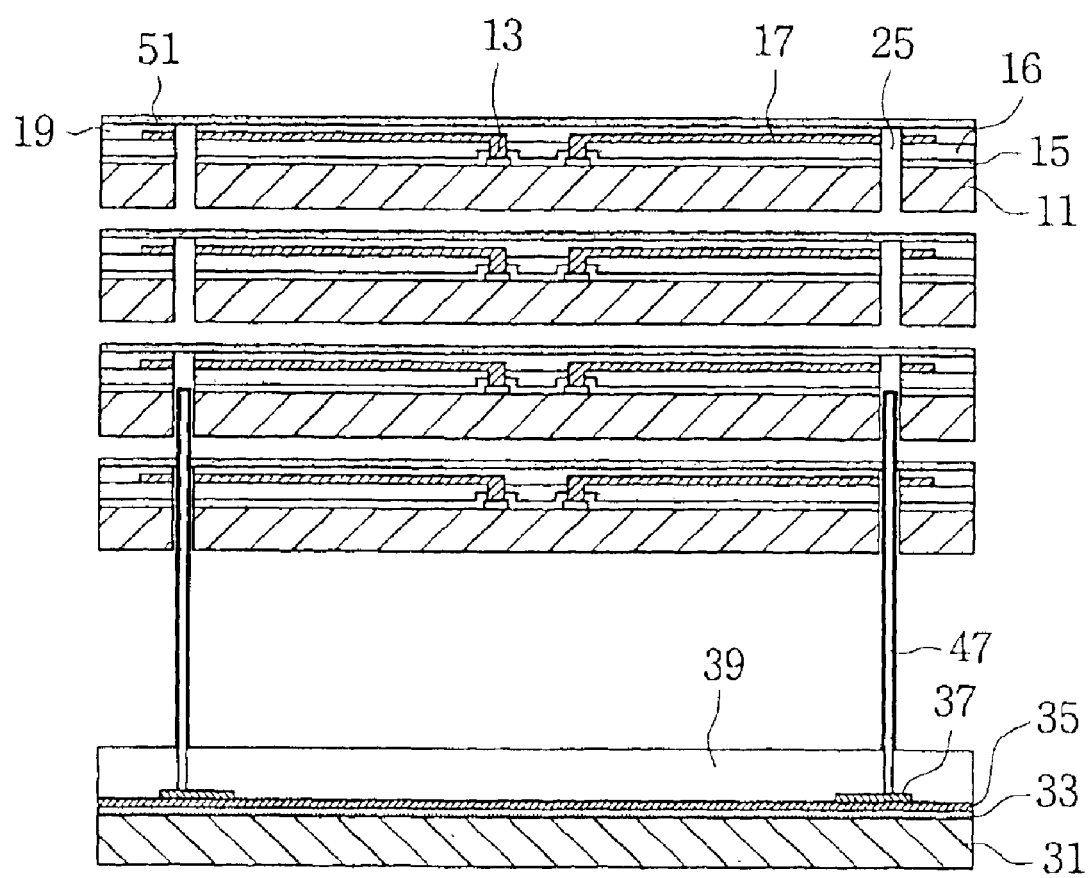

Referring to FIG. 18, a plurality of semiconductor chips 11 made by the chip fabrication process previously described are stacked on the substrate 31 made by the substrate fabrication process that was also previously described. The conductive bar 47 formed on the substrate 31 is inserted into the via hole 25 to penetrate the redistributed pad of the pad redistribution line 17. Before stacking, an adhesive layer 51 may be formed on the second insulating layer 19 of each chip 11 by applying an elastomer and then curing it into B-stage for strong adhesion between the chips. Proper tools such as jigs may be used for aligning, stacking and compressing the chips during the adhesion process.

Figure 19:
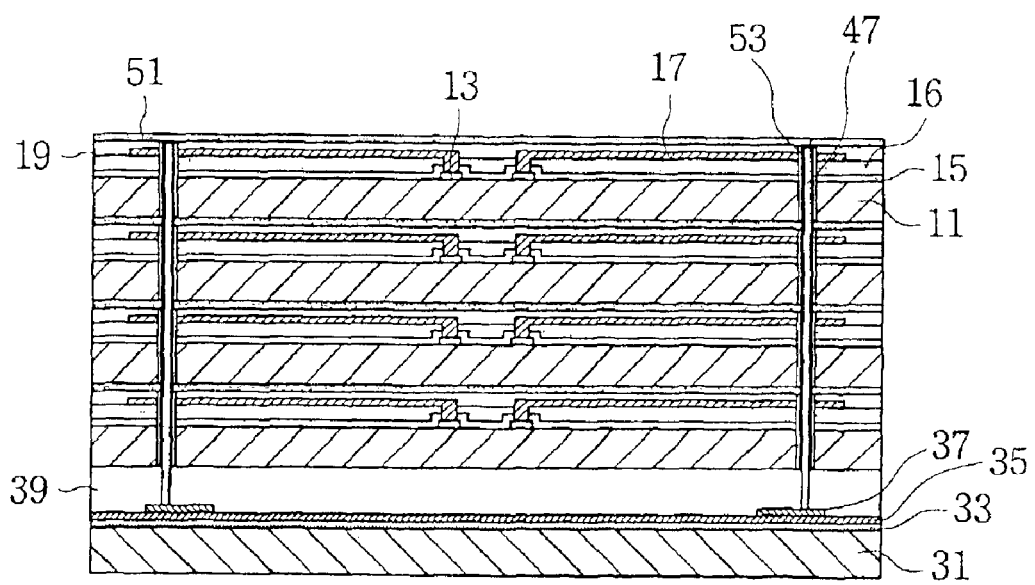
Figure 20:
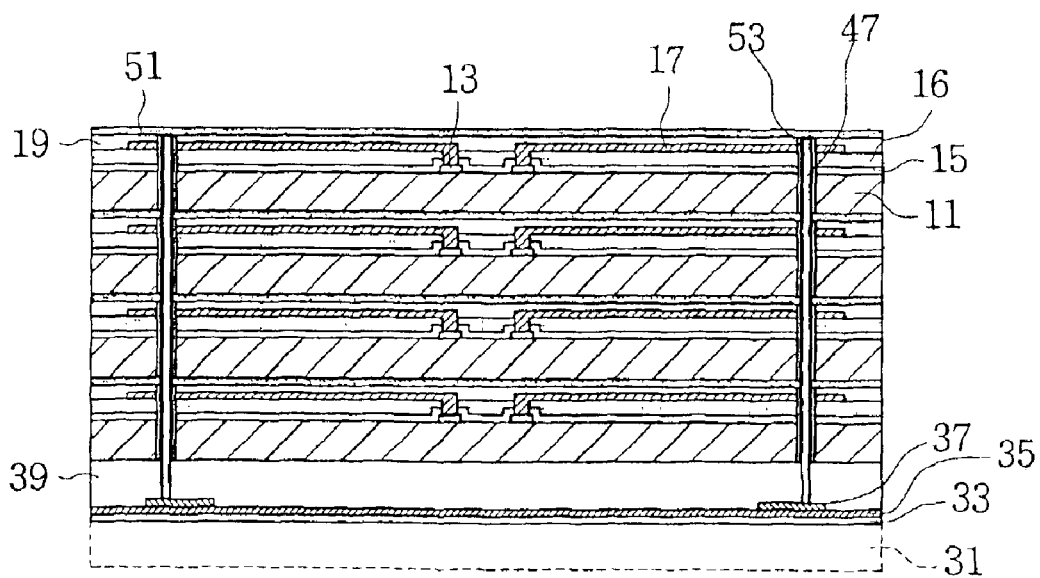
Figure 21:
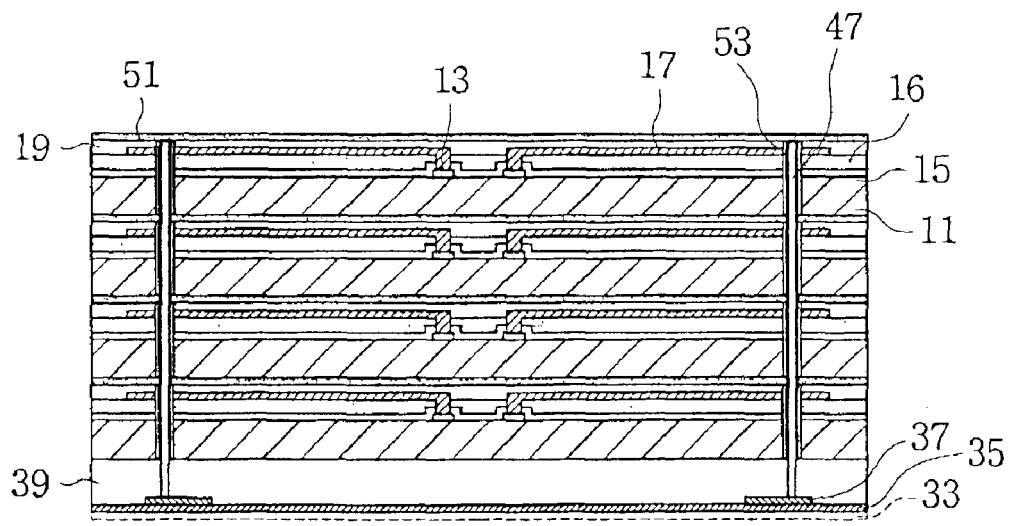

Referring to FIG. 19, a plating layer 53 is formed by electroplating inside the via hole 25 into which the conductive bar 47 has already been inserted. Therefore, the plating layer 53 fills an open space surrounding the conductive bar 47 in the via hole 25 and also connects the conductive bar 47 with the pad redistribution line 17 at the redistributed pad. With the connection between the conductive bar 47 and the redistributed pad, electrical interconnections are established between the plurality of semiconductor chips 11 and the conductive pad 37 of the substrate 31. After the electrical interconnection is made, the temporary substrate 31 is removed as shown in FIG. 20. Then, as shown in FIG. 21, the photosensitive polymer layer 33 is removed so that the conductive pad 37 can be exposed, and then a plasma milling process is carried out to remove the seed metal layer 35.

Figure 22:
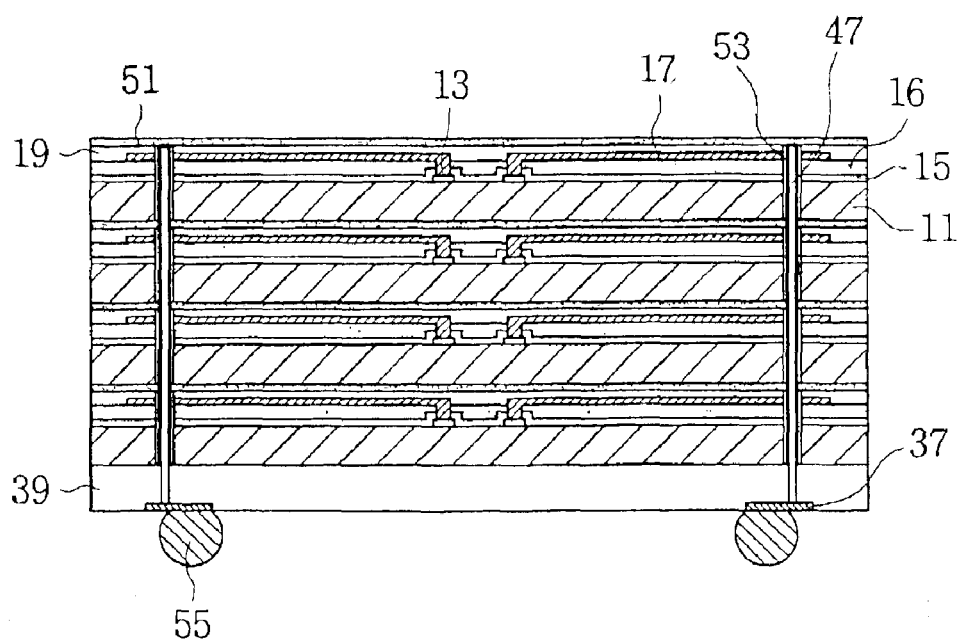

Referring to FIG. 22, solder balls 55 are attached to the exposed conductive pad 37. For attachment, the solder balls 55 are first aligned on the conductive pad 37 and then reflowed. A final form of the solder ball 55 on the conductive pad 37 acts as an external connection terminal for the MCP. Optionally, the uppermost chip 11 is covered with a cap layer (57 of FIG. 2).

According to an embodiment of the present invention, the chips are automatically stacked by simply inserting the conductive bar into the via hole of the chip, thus providing a reliable chip arrangement and preventing the chip alignment failure. Furthermore, since the electrical connections between the chips and the conductive pads are made by the conductive bar and the plating layer inside the via hole, conventional solder bumps between each semiconductor chip are not required for the present invention. This eliminates the possibility of warpage and the need for several solder reflow steps. Moreover, since the substrate is temporarily used only in the manufacturing process and the lowest chip has no substrate but a protective layer in the final form, the total thickness of the present invention MCPs can be significantly reduced. In addition, back lapping of the chips further reduces the total thickness of the MCPs.

Therefore, the present invention prevents the adhesive strength failure due to the increased chip thickness and warpage of the semiconductor chip while simultaneously stacks the plurality of chips without several solder reflow steps.

Although the preferred embodiments of the present invention have been described in detail hereinabove, it should be understood that many variations and/or modifications of the basic inventive concepts herein taught, which may appear to those skilled in the art, will still fall within the spirit and scope of the present invention as defined in the appended claims.

What is claimed is:

1. A method for manufacturing a MCP, the method comprising:

forming a first insulating layer on a semiconductor chip having a chip pad, the first insulating layer having an opening to expose a portion of the chip pad;

forming a pad redistribution line an the first insulating layer, the pad redistribution line electrically connected to the chip pad;

forming a second insulating layer on the first insulating layer to cover the pad redistribution line;

forming a via hole extending through tho chip, the first insulating layer, a pad redistribution pattern and the second insulating layer.

2. The method of claim 1, further comprising back lapping to reduce a total thickness of the MCP by thinning the bottom of the semiconductor chip.

3. The method of claim 1, wherein the forming a via hole comprises:

forming a photosensitive layer on both sides of the semiconductor chip;

forming a hole in the photosensitive layer at the bottom of the semiconductor chip corresponding to a portion of the pad redistribution line to form a mask; and penetrating through the chip, the first insulating layer, a pad redistribution pattern and the second insulating layer, using the mask.

4. The method of claim 3, wherein the penetrating comprises sputtering using a high-density plasma.

5. The method of claim 3, further comprising wet etching to remove burr of the via hole.

6. A The method of claim 3, further comprising removing the photosensitive layers.

7. A method for forming a substrate for manufacturing an MCP having a plurality of stacked semiconductor chips, the method comprising:

forming a polymer layer on one side of a substrate;

forming a conductive pad overlying the polymer layer;

forming a protective layer overlying the conductive pad;

forming a first opening in the protective layer to expose a portion of the conductive pad; and forming a conductive bar extending upwardly from the conductive pad.

8. The method of claim 7, where the forming a conductive bar comprises:

forming a photoresist layer on the protective layer to a thickness corresponding to a total thickness of the stacked semiconductor chips;

forming a second opening in the photoresist layer to expose the portion of the conductive pad, forming the conductive bar by filling the second opening with a conductive material, and removing the photoresist layer.

9. The method of claim 7, wherein the protective layer comprises polyimide.

10. The method of claim 9, further comprising hard-curing the protective layer.

11. The method of claim 7, further comprising forming a metal seed layer on the substrate before forming the conductive pad.

12. The method of claim 7, wherein the polymer layer comprises a photosensitive polymer.

13. A method for forming a MCP, wherein the MCP comprises a plurality of stacked semiconductor chips, each chip including a chip pad on a main surface thereof; a first insulating layer overlying the chip pad, the first insulating layer having an opening to expose a portion of the chip pad; a pad redistribution line formed on the first insulating layer, a second insulating layer covering the pad redistribution line, wherein a via hole is formed through the chip, the first insulating layer, a pad redistribution line and the second insulating layer, the method comprising;

forming a polymer layer on one side of a substrate;

forming a conductive pad overlying the polymer layer;

forming a protective layer overlying the conductive pad;

forming an opening in the protective layer to expose a portion of the conductive pad; and forming a conductive bar extending upwardly from the conductive pad;

inserting the conductive bar into the via holes and stacking the plurality of the semiconductor chips on the substrate such that the conductive bar extends through the via holes of the stacked semiconductor chips, from the conductive pad;

electrically connecting the conductive bar to the pad redistribution line.

14. The method of claim 13, further comprising:

removing the substrate and the photosensitive polymer layer; and attaching an external connection terminal to the conductive pad.

15. The method of claim 13, wherein the electrically connecting the conductive bar to the pad redistribution line comprises forming a plating layer on the conductive bar.

16. The method of claim 13, wherein the protective layer is attached to the bottom of the lowest semiconductor chip, the protective layer including the conductive pad opposite the bottom of the lowest semiconductor chip.

17. The method of claim 13, further comprising forming a coating layer on the conductive pad.

18. The method of claim 17, wherein the coating layer is formed by a Ni electroless plating method.

19. The method of claim 13, further comprising:

attaching a cap layer to the uppermost semiconductor chip.

20. The method of claim 13, wherein the substrate is a glass substrate.

21. The method a claim 17, wherein the glass substrate is made of sapphire.

* * * * *

UNITED STATES PATENT AND TRADEMARK OFFICE
CERTIFICATE OF CORRECTION

PATENT NO. : 6,908,785 B2  
APPLICATION NO. : 10/306931  
DATED : June 21, 2005  
INVENTOR(S) : Kim Page 1 of 1

It is certified that error appears in the above-identified patent and that said Letters Patent is hereby corrected as shown below:

Column 5, line 26, please replace "substrate 31. After" with --substrate 31. ¶ After--  
Column 6, line 7, please replace "line an the" with --line on the--  
Column 6, line 12, please replace "through tho chip" with --through the chip--  
Column 6, line 35, please replace "6. A The method" with --6.  The method--  
Column 7, line 10, please replace "comprising;" with --comprising:--  
Column 8, line 22, please replace "method a claim" with --method of claim--

Signed and Sealed this

Thirteenth Day of February, 2007

JON W. DUDAS  
*Director of the United States Patent and Trademark Office*